United States Patent [19]
Walley

[11] Patent Number: 6,114,888
[45] Date of Patent: Sep. 5, 2000

[54] DIGITAL PHASE LOCK LOOP DIVIDER CYCLING METHOD, APPARATUS, AND COMMUNICATION SYSTEM INCORPORATING THE SAME

[75] Inventor: Kenneth Scott Walley, Portola Hills, Calif.

[73] Assignee: Conexant Systems, Inc., Newport Beach, Calif.

[21] Appl. No.: 09/160,884

[22] Filed: Sep. 25, 1998

[51] Int. Cl.[7] ........................................................ H03L 7/06
[52] U.S. Cl. .......................... 327/157; 327/156; 327/147; 327/148; 327/544
[58] Field of Search ..................................... 327/156, 157, 327/147, 148, 544, 105, 141

[56] References Cited

U.S. PATENT DOCUMENTS 4,893,271  1/1990  Davis et al. .............................. 364/900

*Primary Examiner*—Dinh T. Le
*Attorney, Agent, or Firm*—Foley & Lardner

[57] ABSTRACT

The current disclosure is directed toward part or all digital phase lock loop circuits, particularly those containing divide by N circuits between the voltage controlled oscillator and the phase detector. These divide by N circuits many times contain long logic count down chains. In power sensitive applications the amount of power dissipated by these divide by N circuits may be significant. The current disclosure is directed to apparatus and methods of cycling these divide by N circuits between enabled and disabled to conserve power. The changing of the enabled/disabled frequency and the duty cycle of the disabling of the divider is contemplated, as are the various ancillary factors that might be considered in determining this frequency and duty cycle. Stabilization of the loop is considered as is the changing of gain of the phase lock loop in order to improve operation as the dividers are enabled and disabled.

14 Claims, 4 Drawing Sheets

DIGITAL PHASE LOCK LOOP DIVIDER CYCLING METHOD, APPARATUS, AND COMMUNICATION SYSTEM INCORPORATING THE SAME

FIELD OF THE INVENTION

This invention relates to phase lock loop circuits and, in preferred embodiments to phase lock loop circuits in power sensitive applications, and communications systems and devices employing the same.

BACKGROUND OF THE INVENTION

A phase lock loop (PLL) circuit is a circuit that is used for the synchronization of signals. Phase lock loops are used in a wide variety of electronic circuits where signals containing analog and digital information are decoded. They may be used in optical tachometers, motor control, television receivers, disk drives, modems, radios, and many other fields. Their use within the communications field is extensive.

Phase lock loops may be thought of as synchronizing circuits in which an output frequency is synchronized or locked to a reference frequency.

Some of the most commonly familiar uses of phase lock loops occur within a television receiver. When a signal is sent from a broadcast station to the television receiver the signal must be decoded to represent a picture and sound to be displayed on the television receiver. The television receiver must synchronize the portion of the picture being broadcast that represents the top of the picture to the top of the television screen, the television receiver must also synchronize the portion of the picture being broadcast that represents the left side of the picture to the left side of the television screen. The television receiver must also synchronize the colors received in the signal to the colors displayed on the television, so that the red remains red, the blue remains blue, and all the colors match those being broadcast. Somewhat less apparent is the fact that the television must synchronize itself to the sound carrier signal within the television signal so that the sound associated with the picture may be properly demodulated and reproduced through the speakers. All of these synchronizations typically occur through the use of phase lock loops in which the signals which are broadcast from the television transmitter are synchronized to the television circuits which actually display these signals.

PLLs are also used in mobile communication applications related to such purposes as frequency generation, signal modulation and demodulation, and data decoding and encoding.

PLLs are unsynchronized when they power on or have no reference signal. In this condition the PLLs are said to be unlocked or out of lock. Phase lock loops generally work by comparing a reference frequency to a generated output frequency and adjusting the output frequency to match the reference frequency. As the output signal is adjusted by the loop there occurs a point at which the frequencies of the output and reference signals match. At this point the signals are sometimes said to be in frequency lock. When the generated frequency is further synchronized in phase with the input frequency the condition is often referred to as phase lock, the locked state, or simply lock. During lock, when the output frequency is synchronized with the reference frequency, the phase error between these signals may be very small or even zero. In the lock state the output signal will generally stay in lock until the phase lock loop is somehow perturbed. Some common factors that perturb phase lock loops are loss of the reference frequency, a change in the frequency or phase of the reference frequency, noise on the reference frequency, or noise in the system which disturbs the loop.

There are large number of variations of phase lock loops, and a large number of possible classifications, but they can be grouped into phase lock loops which contain only analog components, and phase lock loops that contain some or all digital components. The common analog or linear phase lock loops were the first to be developed. These phase lock loops ordinarily consist of three parts: 1) the phase detector, which compares the incoming reference frequency to the output frequency, 2) the loop filter, which is typically a low pass type filter built form an active or passive RC filter, and 3) a voltage controlled oscillator. Digital elements have been gradually integrated into PLLs and hybrid versions have emerged which contain both analog and digital functions. All digital phase lock loop versions have also emerged in which all of the circuit functions are performed by digital circuits. With the advent of cheap fast microcontrollers software versions of the phase lock loop, in which the loop functions are performed by a high speed microprocessor or microcontroller, have been developed. All of the different varieties of phase lock loops find use in modern electronics, with the digital versions achieving increasing popularity as their costs drop and their level of integration increases.

The various versions of phase lock loops behave differently and there is no universal theory that covers all versions of PLLs. There is also a great deal of variation in implementation details as phase lock loops are commonly tailored to the many applications that they serve. Because of the great variations, phase lock loops do not completely lend themselves to hard and fast rules defining classifications. The different types of phase lock loops, fortunately, have many parts in common and many of the principles that apply to one apply to the others.

An example of an analog or linear phase lock loop is shown in FIG. 1. A reference frequency signal 103, is provided to a phase detector 105, where it is compared with the output frequency signal 115. The phase detector 105, compares the phases of the two signals and produces an output 107 that is proportional to the phase difference between the signals. The output of the phase detector 107 is then coupled to a loop filter 109, which determines the frequency response, and produces an output signal 111. The output of the loop filter 111 is coupled to a voltage controlled oscillator 113 which maintains the same frequency if the loop was locked, that if the output frequency signal and the reference frequency signal were in phase. If the output frequency signal and the reference frequency signal are not in phase the output of the loop filter 111 will be such as to adjust the frequency of the voltage controlled oscillator 113 in order to bring the circuit into lock.

The phase lock loop has found extensive use in mobile communication circuits such as portable telephones. They are used to lock to transmitting and receiving frequencies and to recover clock signals from different digital data formats such as return to zero (RZ) and non return to zero (NRZ). As the communications devices, particularly portable telephones, have grown smaller and smaller the desire to obtain more operating time out of smaller and smaller packages has increased. Both small size and long battery life, which can be somewhat opposite constraints, are typically seen as desirable characteristics.

There are two ways to address the desire to have smaller portable communications devices with increased operational time. The first is to produce more powerfull batteries with a higher energy density and the second is to produce circuitry that consumes less power.

Several approaches are in use to minimize the rate of power consumption by these portable devices. One approach is to minimize the voltage on the circuitry within these portable devices by using circuit components that can operate at lower voltages. Another approach to minimize power consumption is to adopt techniques to enable operation of circuitry within the portable units only part of the time instead of continuously. For example the TDMA (Time Division Multiple Access) protocol, which allows several portable phones to share the same frequency by broadcasting only part of the time in successive time slots. By broadcasting during a time slot instead of continuously, the output power amplifier can be shut off for most of the time that the phone is active and the power is conserved.

SUMMARY OF THE DISCLOSURE

Accordingly, preferred embodiments of the present invention relate to communications systems and processes which address the problem of producing mobile communications circuitry which minimizes power consumption while maintaining or enhancing performance.

In one embodiment of the invention, a digital PLL containing a divide by N circuit which may be enabled and disabled, is included within the loop. When the divide by N circuit is disabled the PLL is no longer controlling the voltage controlled oscillator, a condition sometimes referred to as free run. A controller is connected to the divide by N circuit for providing enabling and disabling signals to the divide by N circuit. The controller stabilizes the PLL to insure that the PLL is not perturbed when the divider circuit is enabled and disabled. It is desirable that the loop not be perturbed immediately prior to the time it is allowed to free run. Such a perturbation will not be corrected by the loop because the loop is no longer in control. When the divider circuit of the phase lock loop is disabled it is no longer exercising its count down function and is no longer switching states. Counting down and continually switching states consumes a significant amount of power.

In another embodiment of the invention the divide by N circuit is enabled and disabled to conserve power, wherein the duty cycle of the enable and disable cycling is dynamically changed depending on various circuit parameters. For instance, the decoder circuit phase lock loop for decoding digital signals may be disabled for a longer period of time, if there are no digital signals being received to decode. In such a case, where the divider's duty cycle has a significant disabled period, performance may be improved if the controller were to increase the loop gain of the PLL coincident with the enabling of the divider circuit and reestablishment of PLL control.

Modern digital phones are a source of circuit noise. The switching circuits within these phones tend to produce noise spikes as they switch on and off. During these periods this noise may perturb the PLL, causing phase error, or even loss of lock. Many of these noise spikes occur at times that are well known to designers. For example, in a phone using a TDMA protocol, the intervals when the broadcast power amplifier is being turned on and off are periods when it is highly likely that noise spikes will occur. Accordingly, in another embodiment of the invention the divide by N circuit is cycled between enabled and disabled for a specific duty cycle and the time that the loop is disabled is selected to coincide with periods when it is likely that noise will be generated within the system.

In yet another embodiment the invention the divide by N counters are cycled between enabled and disabled according to certain modulation protocols, such as sigma-delta, or pseudo random. Accordingly certain periodic forms of noise, that might be injected into the loop if the PLL's enable and disable cycling were locked to a regular periodic frequency, are avoided.

DETAILED DESCRIPTION OF PREFERRED EMBODIMENTS

Figure 1:
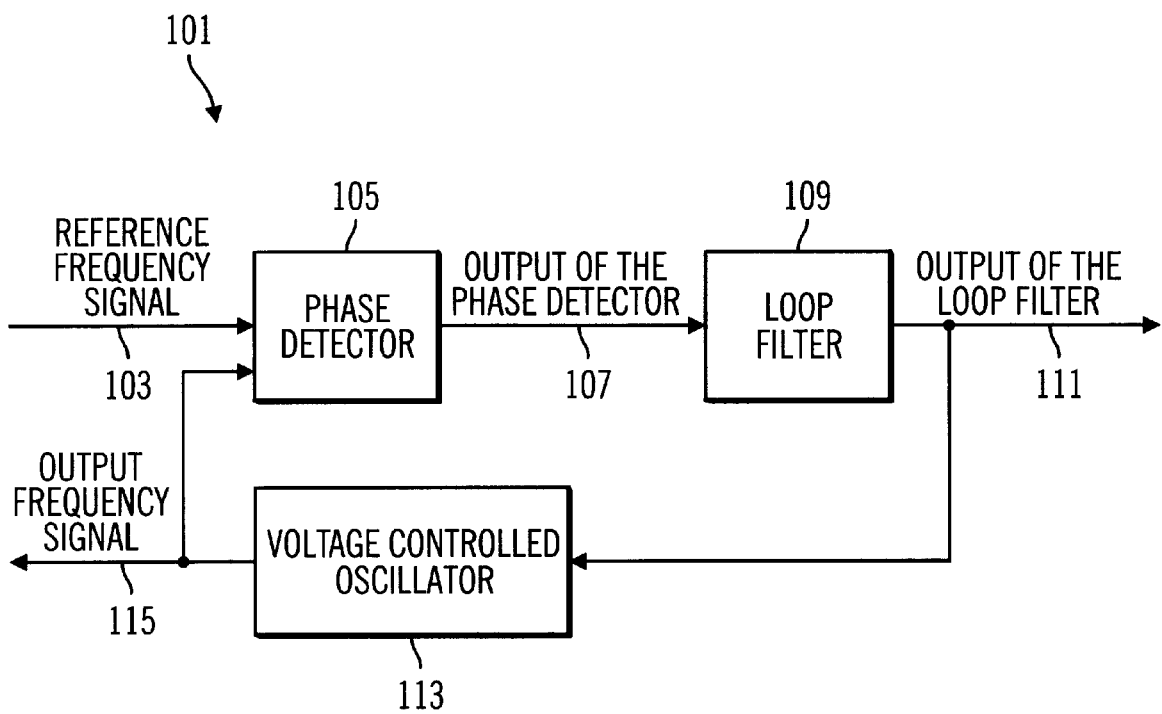
FIG. 1 a block diagram of a conventional analog phase lock loop circuit.
Figure 2:
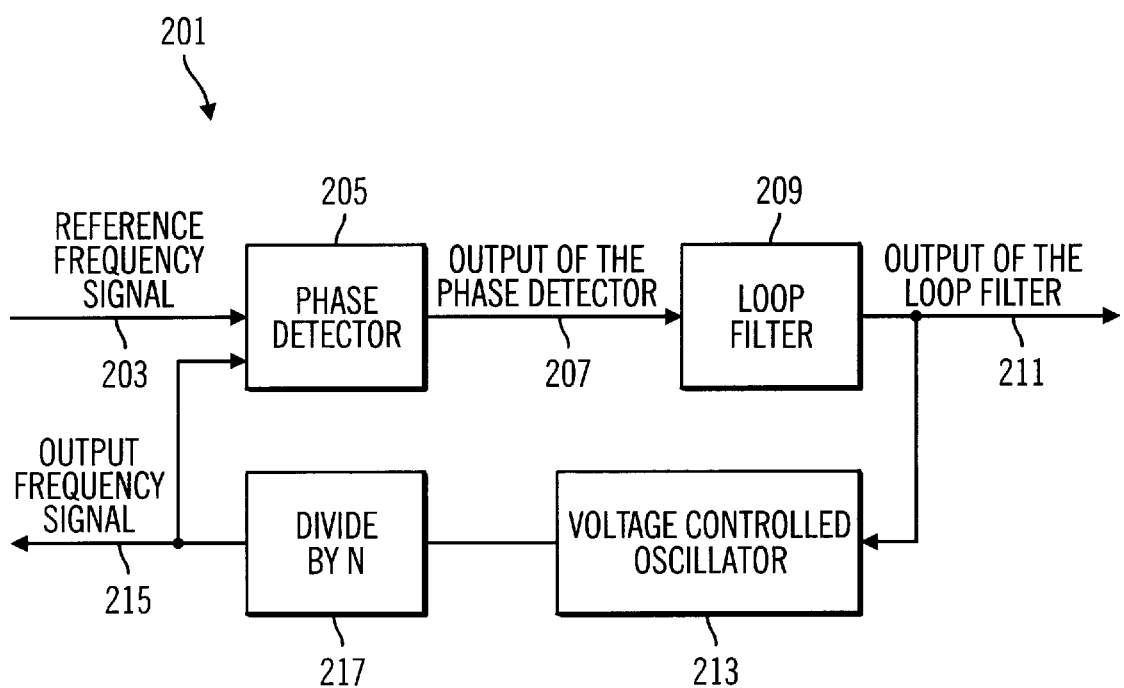
FIG. 2 is a block diagram of an example of a digital phase lock loop containing a conventional divide by N circuit.

An example of a digital phase lock loop is shown in FIG. 2. In this example the reference frequency signal 203 is provided to a reference input of a phase detector 205. The phase detector 205 commonly employs a digital circuit such as an EXOR gate, phase-frequency detector circuit (PFD), edge triggered JK-flipflop, or other circuit well known in the art for the purpose of phase detection. The phase detector 205 is coupled to detect the phase difference between the reference signal and the output, 215, of a divide by N circuit 217. The output of the phase detector represents the phase difference between the reference signal and the output of the divide by N circuit. It is common practice in digital phase lock loops to include divide by N circuits between the voltage control oscillator 213 and the phase detector 205. In the case where a divide by N circuit is included between the voltage control oscillator 213 and the phase detector 205, the voltage control oscillator operates at a frequency that is N times the reference frequency 203. The output of the phase detector 207 is coupled into the loop filter 209, which may be analog, digital or a combination of both. The output of the loop filter 211 is coupled to the input of the voltage controlled oscillator 213, for adjusting the frequency, and hence the phase, of the voltage controlled oscillator 213. The output of the voltage controlled oscillator is then fed into the divide by N circuit where it is divided down to the same frequency as the reference signal frequency and then fed into the phase detector 205. In digital phase lock loop circuits that contain divide by N counters, the counters are typically active and counting even when there is no reference frequency present. In portable applications, where the power source is limited, these counters can consume a significant amount of power.

Figure 3:
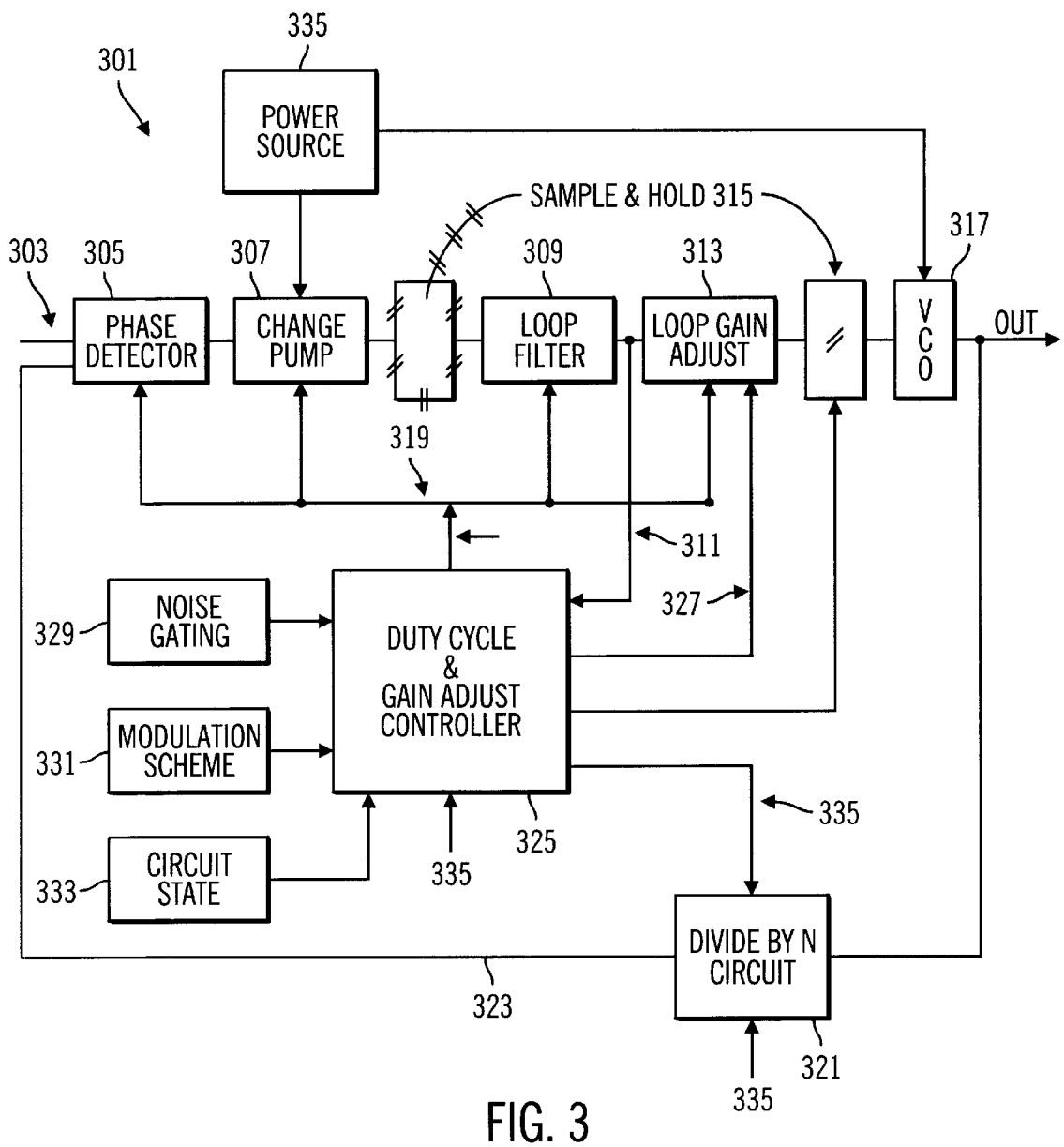
FIG. 3 is a block diagram of a digital phase lock having various mechanisms of control in accordance with several embodiments of the invention.

Various embodiments of the invention can be explained with reference to FIG. 3, wherein 301 depicts a digital PLL circuit illustrated with various mechanisms of control which can be used with different embodiments of the invention. A reference frequency signal 303 is provided to one input of a phase detector 305, where it is compared with an input 323 provided by a divide by N circuit 321. The output of the phase detector may be coupled to a charge pump 307 which is a circuit that is included in various implementations of phase lock loops. Alternate embodiments may omit the charge pump.

The output of the charge pump 307 (or the phase detector 305, if a charge pump is not included) is coupled to a loop filter 309, which may contain analog circuits, digital circuits, or a combination of both. The loop filter 309 may be coupled to a gain adjust block 313. Alternative embodiments may omit the gain adjust block 313. The gain adjust 313 is used to change the gain of the PLL, and hence the rate at which the loop synchronizes (pulls in), locking the reference frequency 303 with the output of the divide circuit 323. The gain adjust 313 may also be used to compensate for the fact that cycling of the divide by N circuit changes the gain of the loop. It is used with embodiments of the invention that may use a change in gain to affect the speed of synchronization of the PLL. The speed of synchronization is generally a trade off with the noise rejection of the PLL.

The output of the gain adjust 313 (or the loop filter 309 in embodiments which do not have a gain adjust) is coupled to a sample and hold circuit 315. The sample and hold circuit 315 is useful in some embodiments of the invention for the purpose of stabilizing the loop and immunizing it from perturbations which might occur when the divider circuit is disabled and enabled. The sample and hold may be located in a variety of positions in the PLL, and is shown in a typical position. The sample and hold, in embodiments where it is present, (or the gain adjust 313, or loop filter 309 where it is not present) is coupled to the VCO (voltage controlled oscillator) 317. The input to the VCO 317 controls the frequency at which the VCO oscillates and hence the frequency that is fed into the divider circuit 321. The divider circuit divides the output of the VCO by N and the resulting output frequency +323 is then coupled back to the phase detector 305, for comparison with the reference frequency.

The duty cycle and gain adjust controller (controller) 325 controls various PLL elements. The controller 325 may be implemented through combinational digital circuits, state machines, microcontrollers or various other means well known in the art. The controller 325 may have one or more inputs (311, 329, 331, and 333) in accordance with various embodiments of the invention. The input 311, which is connected to the loop filter, is used to determine whether the PLL is in lock or not. The noise gating input 329 indicates to the controller 325 that some circuit is in a state where system noise may be generated. The modulation scheme input may contain different modulation algorithms, such as sigma delta or pseudo random which may be used by the controller 325 to control the cycling between enabled and disabled of the divide by N circuit 321. The circuit state input 333 to the controller 325 provides status information to the controller concerning the state of the rest of the system and the status of the other subsystems. The controller 325 may have one or more outputs (319, 327, and 335) in accordance with various embodiments of the invention. The enable/disable control line 319 is used in certain embodiments to enable and disable different portions of the PLL when they are not in use. The gain adjust control line 327 is used to increase and decrease the gain of the PLL, which is used to increase the gain and hence the speed of synchronization of the loop. The controller 325 uses the divide by N control line 335 to control the enabling and disabling of the divide by N circuit 321. The controller can control the frequency with which the divide circuit 321 and other elements of the loop are cycled between enabled and disabled, and also the duty cycle of the enabled and disabled periods within that frequency. In other words the controller would control what percentage of the time within the enable/disable cycle that the circuits are enabled and the percentage of the time that they are disabled.

In a first example embodiment of the invention the controller 325 enables and disables the divide by N circuit 321. Divide by N circuits may typically be implemented as a chain of flip flops and comparison logic. Disabling the divide circuit 321 will result in a saving of the energy that would be consumed as the divider chain, within the divide circuit, switches states in order to accomplish it's divide by function.

The duty cycle of the enable and disable cycling is determined by the controller and may depend on a variety of factors having to do with loop stability, component drift, required re synchronization time, and a variety of other factors. In this embodiment when the divider circuit is disabled, it is preferable to insure that the disabling of the divide circuit 325 does not perturb the loop. This is because, when the divide is disabled, the corrective control of the loop is disabled and any perturbation will not be corrected until loop control is reestablished. This stabilization may be achieved by a variety of methods. In this embodiment the controller 325 switches the enable/disable control line 319 signifying that the divider is being disabled. The enable/disable control line is used for the purpose of insulating the VCO (voltage controlled oscillator) 317 from any perturbation of the loop that this transition might cause. This might be achieved by enabling the sample and hold circuit 315. At that time disabling the phase detector 305, the charge pump 307, the loop filter 309, or the gain adjust 313 might be used in order to save the power that is being consumed by the individual circuits. The divide circuit traditionally consumes a substantial portion of the power consumed by the loop. It should be understood, however, that when the enable/disable cycling of the divide circuit 321 is mentioned, it may also include enabling and disabling of the other components of the loop.

Upon disabling the divider circuit 321 and stabilizing the loop as described above, the voltage controlled oscillator is allowed to free run, that is run without any correction being applied. The amount of time it can free run is dependent on many factors such as the use to which the phase lock loop is being put, the amount of drift that the particular circuit can tolerate, how stable the components are within the loop, whether the loop was locked, whether the circuit containing the loop is in an active or standby condition, and a variety of other factors. The controller circuit 325 also insures that when the divider circuit is enabled the loop is not perturbed any more than is necessary, by properly timing the enabling of loop components and the divide by N circuit 321.

Figure 4:
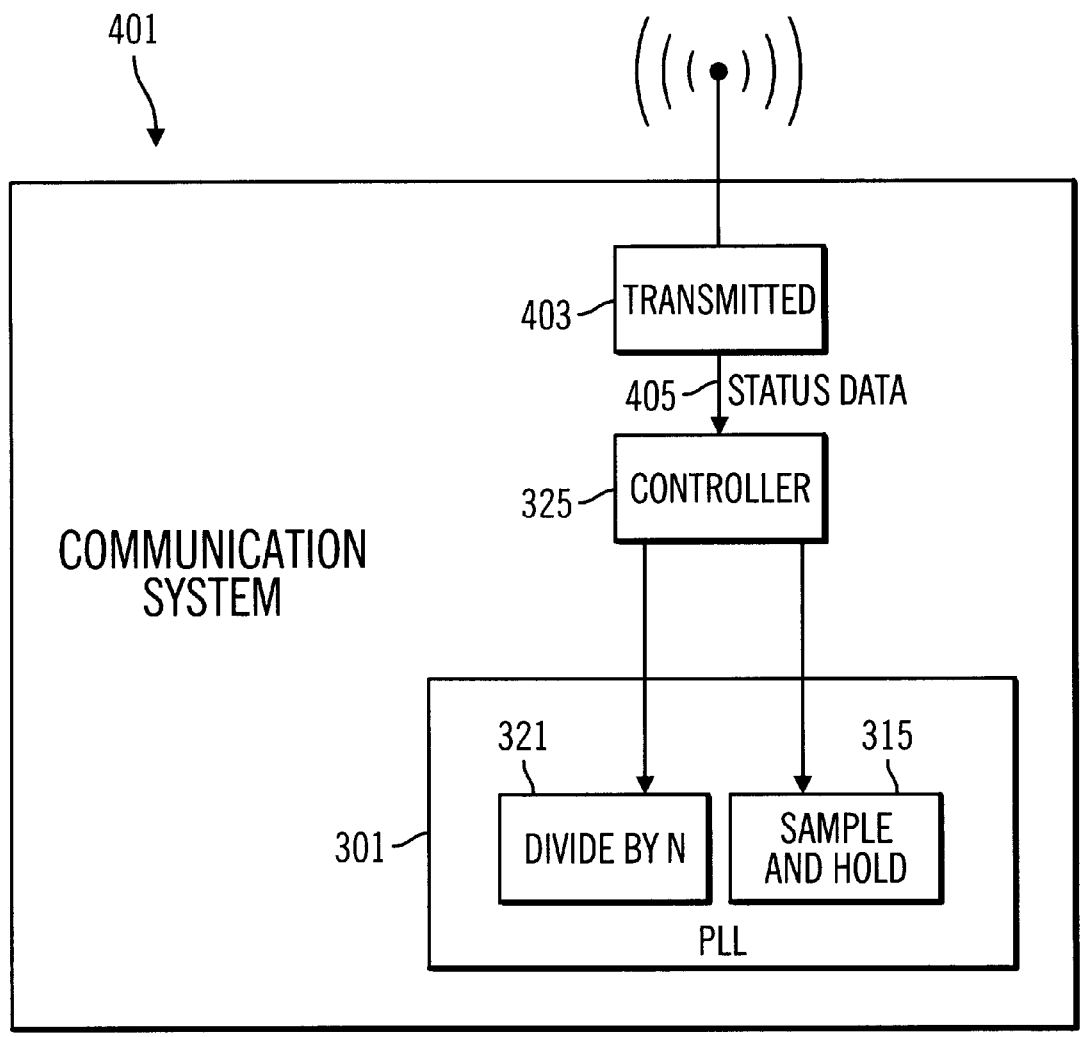
FIG. 4 is a block diagram of a communication system with in accordance with an embodiment of the invention.

FIG. 4 is a block diagram illustrating a communication system in accordance with an embodiment of the invention, In FIG. 4 the communication system 401 comprises a transmitter 403. The transmitter 403 provides status data 405 to the controller 325. The status data, 405 provided to the controller comprise an indication as to whether the transmitter 403 is transmitting or not transmitting. The controller 325 accepts the status data and controls the divide by N circuit 321 and the sampler and hold circuit 315 within the phase lock loop 301. During a period when the transmitter 403 is transmitting the controller may turn on the sampler and hold circuit 315 and turn off the divide by N circuit 321, thereby saving power that would be consumed by the divide by N circuit 321 and insulating the PLL 301 from any perturbation that would be caused by either the disabling of the divide by N circuit 321 or by noise caused by the transmitting of a signal at the transmitter 403.

In another embodiment a circuit state signal 333 is input to the controller. In this embodiment the divide by circuit is disabled dependent on circuit parameters. The circuit state may contain different parameters dependent on what type of system the PLL is embedded in.

For example in a portable phone, embodiment wherein the particular phase lock loop is used for encoding digital data for broadcast, the state information might include a state variable signifying whether the portable phone had or was about to establish a connection to a base unit or was sitting in a idle state active only to receive calls. In such a case where the phone was in an idle state, the divider circuit 321 and other power consuming portions of the PLL would enabled and disabled with a duty cycle biased to the disabled state as encoding of data was not imminent. When the state variable changed indicating a change in the circuit state 333, for instance upon receiving an incoming call indicating that the phone would likely be broadcasting soon, the controller would increase the gain of the PLL using the loop gain adjust 313, which would hasten the reacquisition of phase lock. In further embodiments the controller also increases the enabled portion of the duty cycle of the PLL by enabling the divide by N circuit 335 and any other elements for a longer portion of the enable/disable cycle. In further embodiments the controller also monitors the output of the loop filter 309 to ascertain if the PLL had achieved lock, and then adjusts the loop gain 313 and the enable/disable duty cycle of the divide circuit depending on whether the lock state had been achieved or not.

A further embodiment of the situation where the divider circuit 321 is disabled dependent on circuit parameters involves a phone using the TDMA (time division multiple access) protocol. In the TDMA protocol the phone is assigned a time slot in which to broadcast, and must not broadcast in time periods allotted to other units. For example if the phone were assigned the seventh time slot in which to broadcast, the dividers would be disabled for a large portion of the duty cycle that fell within the other time slots. Just prior to the seventh time slot the dividers would be enabled and the gain of the phase lock loop increased for a time period prior to broad cast while the loop reacquired a solid phase lock. Increasing the loop gain would hasten the phase resynchronization after the free run period. The loop gain would then be lowered, to provide greater noise immunity, as the time slot in which the portable phone is assigned to broadcast occurs. Typically the time slot in which the portable phone is broadcasting is a high noise period and as the broadcast power amplifier is cycled on and off and low PLL gain, with high noise immunity, may be desired. The dividers would then run normally, at an increased or even 100% enabled duty cycle, while the phase lock loop is used to encode the digital data to be broadcast and then go back to being enabled and disabled to save power after the data was encoded. The process would then be repeated as the next time slot for the broadcast cycle occurred.

Another embodiment of the invention involves modifying, not the percentage of the enable disable cycling of the divider nor the frequency of the cycling of the enabling and disabling of the divide circuit, but the time during the cycle the that the divider is disabled. In this aspect of the invention the start of the disabled time of the divide circuit is controlled to coincide with events in the rest of the circuitry that may perturb the loop. For example if the divide circuit 321 were disabled with a 40% duty cycle it would be disabled for 40% of the enable/disable period. If during the last 30% of the enable/disable period some other portion of the circuit would be generating noise, then by synchronizing the noise with the period when the loop was disabled not only is power saved but performance is improved. This is because the time period when the PLL is most likely to be perturbed by noise, it is actually free running (that is the time when the dividers are disabled). Any noise imposed on the reference frequency or the output frequency during the free run period does not enter the loop at the phase detector, as would normally happen, and simply has no effect. In other words the synchronizing of the free run, or disabled, time of the loop with the occurrence of noise can reduce the effect of the noise or even eliminate it entirely.

In another embodiment of the invention the divide by circuit is disabled and enabled according to algorithms to avoid introducing periodic noise into the loop. In this embodiment of the invention the time of occurrence of the disabled portion of the enable/disable divider cycling is modified, not according to any type of circuit gating, but instead according to a pre selected algorithm. The algorithm can be a sigma delta modulation scheme, or a pseudo random scheme, or any of another schemes known in the art. The purpose of this type of modulation of the divider cycling is so that the periodicity of the divide by N power cycling will not introduce any cyclical or periodic noise into the PLL. If the frequency of divider cycling were 1 kHz, for example, harmonics of 1 kHz might be introduced into the loop. If the occurrence of the disabled cycle (or conversely the enabled cycle) were changed in a pseudo random fashion between 500 Hz and 2 kHz then the noise injected might have an effective frequency between 500 Hz and 2 kHz and thereby the regular harmonic noise that might be generated if the divider circuit were cycled at 1 kHz might be effectively minimized.

It may be appreciated by one skilled in the art that the embodiments of the divider cycling that are contained in the example embodiments of this invention are not mutually exclusive. The frequency of the divider enable and disable cycling may be adjusted and the duty cycle of the divider disable/enable cycling might be adjusted in various combinations in further embodiments of the invention. The duty cycle of the power cycling may be adjusted to encompass noise gating as well as pseudorandom adjustment of the enable/disable timing. The loop gain may be adjusted according to states of other portions of the circuit and the divider cycling timing and duty cycle adjusted concurrently. It is contemplated that further embodiments of the invention may combine several or all of the aspects of the various embodiments described, and may modify them dependent on the particular implementation in which the PLL appears.

I claim:

1. A phase lock loop including: a voltage controlled oscillator, said voltage controlled oscillator producing a periodic signal having a phase and a frequency dependant on a control signal; a divide by N circuit for accepting the periodic signal from the voltage controlled oscillator and dividing the frequency of a signal from the voltage controlled oscillator by N thereby producing a divided periodic signal, said divided signal having a frequency divided by N relative to the periodic signal from the voltage controlled oscillator; a phase detector circuit for comparing the output phase of the divide by N circuit with the phase of a reference signal and providing a control signal proportional to the difference in phase between the phase of the output of the divide by N circuit and the phase of the reference signal; a loop filter coupled to the control signal output of the phase detector and providing filtering to the control signal and producing a loop filter output signal for coupling to the voltage control oscillator for controlling the frequency of the voltage controlled oscillator and a controlling apparatus comprising:

a controller coupled to a divider control input of said divide by N circuit for disabling the divide by N circuit; and a sample and hold circuit for receiving the control signal provided by the loop filter and sampling and holding said control signal responsive to the controller, said sample and hold circuit disposed between the control signal output of the loop filter and the control input of the voltage controlled oscillator, said sample and hold providing a constant input to the voltage controlled oscillator when the output of the sample and hold is being held, said holding of the output of the sample and hold circuit thereby preventing the disabling of the divide by N circuit from coupling through the phase detector and significantly changing the frequency of the voltage controlled oscillator.

2. The phase locked loop circuit as in claim 1 wherein the controller adjusts period of the disabling of the divide by N circuit responsive to a signal received at an input terminal.

3. The phase locked loop circuit as in claim 1 wherein the controller receives the loop filter signal indicating a first lock in which said phase lock loop is locked to the reference signal and a second lock status in which said phase lock loop is not locked to the reference signal, for adjusting the period of the disabling of the divide by N circuit dependent on the first and second lock status.

4. The phase locked loop of claim 3 further comprising:
a variable amplifying element, the amplification of said variable amplifying element being adjusted by the controller, said variable amplifying element being disposed between the loop filter and the sample and hold circuit of the phase lock loop
wherein
the controller adjusts the amplification of the variable amplifying element based on an input status data and the period of disabling of the divide by N circuit.

5. A phase locked circuit as in claim 2 wherein the phase locked loop circuit is contained within a communication system and the status data comprises states of transmitting and not transmitting.

6. An apparatus as in claim 5 wherein the communication system is a TDMA phone.

7. A portable communication system comprising:
a source of power;
a digital phase lock loop coupled to said source of power including a voltage controlled oscillator, said voltage controlled oscillator producing a periodic signal having a phase and a frequency dependant on a control signal, a divide by N circuit for accepting the periodic signal from the voltage controlled oscillator an dividing the frequency of the periodic signal from the voltage controlled oscillator by N thereby producing a divided periodic signal having a frequency divided by N relative to the periodic signal from the voltage controlled oscillator; a phase detector circuit for comparing the output of the divide by N circuit with a reference signal and providing a control signal proportional to the difference in phase between the phase output of the divide by N circuit and the phase of the reference signal; a loop filter coupled to the control signal output of the phase detector and providing filtering to the control signal and producing a loop filter output for coupling to the voltage controlled oscillator for the purpose of controlling the frequency of the voltage controlled oscillator; and
a controller including circuitry for periodically disabling the divide by N circuit; and a sample and hold circuit for receiving the control signal provided by the loop filter and sampling and holding said signal responsive to said controller, said sale and hold disposed between the loop filter and voltage controlled oscillator and holding the output of the sample an hold circuit constant during the disabling of the divide by N circuit thereby preventing the periodic disabling of the divide by N circuit from significantly changing the frequency of the voltage controlled oscillator.

8. A portable communication system as in claim 7, wherein the controller adjusts the period of disabling of the divide by N circuit responsive to a status data received at an input terminal.

9. The portable communications system as in claim 8 wherein the controller receives the loop filter signal indicating a first lock status in which said phase lock loop is locked to the reference signal and a second lock status in which said phase lock loop is not locked to the reference signal for adjusting the period of disabling of the divide by N circuit dependent on the first and second lock status.

10. The portable communications system as in claim 8 further comprising
a variable amplifying element, the amplification of said variable amplifying element being adjusted by the controller, said variable amplifying element being disposed between the loop filter and the sample and hold circuit of the phase lock loop, the controller adjusting the amplification of the variable amplifying element based on the status data and the period of disabling of the divide by N circuit.

11. A method for controlling a divide by N circuit of a phase lock loop, the phase lock loop including a voltage controlled oscillator said voltage controlled oscillator producing a period signal having a frequency and a phase, a divide by N circuit for accepting the periodic signal of the voltage controlled oscillator and for dividing the frequency of the signal from the voltage controlled oscillator by N thereby producing an output signal divided by N in frequency, a phase detector circuit for comparing the phase of the output of the divide by N circuit with the phase of a reference signal and providing a control signal proportional to the phase difference of the output of the divide by N circuit and the reference signal, a loop filter coupled to the control signal output of the phase detector and providing filtering to the control signal and producing a loop filter output signal for coupling to the voltage control oscillator for the purpose of controlling the frequency of the voltage controlled oscillator, for cyclically disabling and enabling the function of the divide by N circuit the method comprising the steps of:
sampling and holding said loop filter output sign using a sample a hold circuit disposed between said loop filter and said voltage controlled oscillator in response to a controller; and
holding the output of the sample and hold circuit constant during disabling of the divide by N circuit by the controller thereby preventing disabling of the divide by N circuit from coupling through the phase detector and changing the frequency of the voltage controlled oscillator.

12. A method as in claim 11 wherein the controller adjusts period of the disabling of the divide by N circuit responsive to a status data received at an input terminal of said controller.

13. The method as in claim 11 further comprising:
detecting lock state of the phase lock loop;
adjusting period of the disabling of the divide by N circuit based on the lock state of the phase lock loop.

14. The method as in claim 12 further comprising:
inserting a variable amplifying element between the loop filter and the voltage controlled oscillator of the phase lock loop; and
adjusting the amplification of the element responsive to a status data received at the input terminal and the period of disabling the divide by N circuit.

* * * * *